United States Patent [19]
Mitwalsky et al.

[11] Patent Number: 5,789,302
[45] Date of Patent: Aug. 4, 1998

[54] CRACK STOPS

[75] Inventors: Alexander R. Mitwalsky, Poughkeepsie; Tze-Chiang Chen, Yorktown Heights, both of N.Y.

[73] Assignees: Siemens Aktiengesellschaft, Munich, Germany; International Business Machines Corporation, Armonk, N.Y.

[21] Appl. No.: 823,668

[22] Filed: Mar. 24, 1997

[51] Int. Cl.$^6$ .................................................. H01L 21/46
[52] U.S. Cl. ................................ 438/462; 438/460
[58] Field of Search .......................... 438/460, 465, 438/462

[56] References Cited

U.S. PATENT DOCUMENTS

| | | | |
|---|---|---|---|
| 4,610,079 | 9/1986 | Abe et al. | 29/583 |
| 4,925,808 | 5/1990 | Richardson | 437/62 |
| 5,017,512 | 5/1991 | Takagi | 437/227 |
| 5,096,855 | 3/1992 | Vokoun, III | 437/227 |
| 5,136,354 | 8/1992 | Morita et al. | 438/462 |
| 5,217,916 | 6/1993 | Anderson et al. | 438/462 |
| 5,414,297 | 5/1995 | Morita et al. | 438/462 |
| 5,418,190 | 5/1995 | Cholewa et al. | 437/226 |
| 5,422,286 | 6/1995 | Yang | 438/462 |
| 5,599,746 | 2/1997 | Lur et al. | 438/462 |

*Primary Examiner*—Kevin Picardat
*Attorney, Agent, or Firm*—Stanton C. Braden; Dexter K. Chin

[57] ABSTRACT

Crack stops for substantially preventing cracks and chips produced along the dicing channel from spreading into the active areas of the ICs are described. The crack stops are formed by creating discontinuities in the thickness of the dielectric layer in the dicing channel near the chip edges. The discontinuities can result in increasing and/or decreasing the thickness of the dielectric layer.

13 Claims, 4 Drawing Sheets

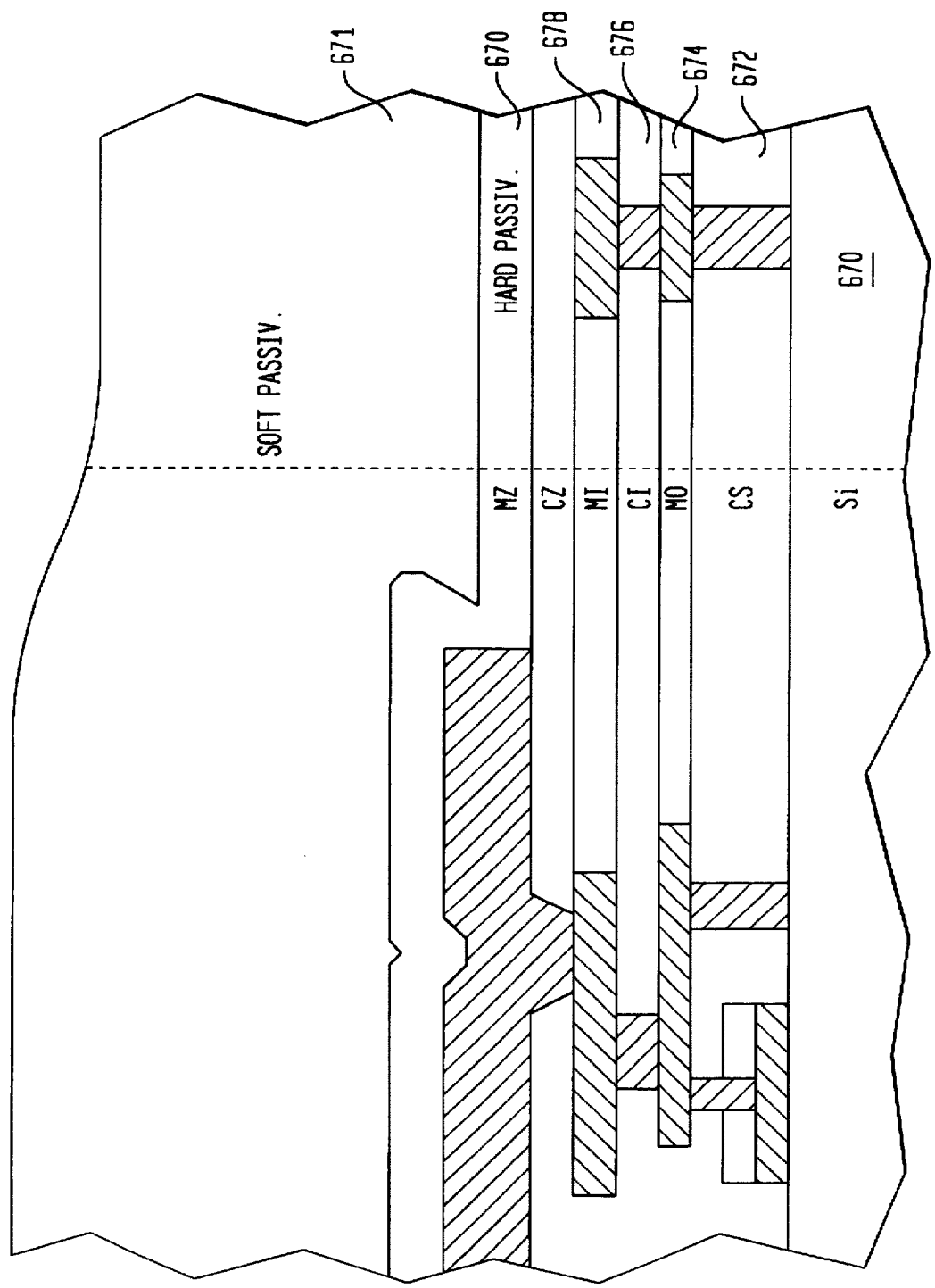

CRACK STOPS

FIELD OF THE INVENTION

The present invention relates generally to the fabrication of semiconductors and, more particularly, to reducing cracks and chips during wafer dicing.

BACKGROUND OF THE INVENTION

In semiconductor fabrication, insulating, semiconducting, and conducting layers are formed on a substrate. The layers are patterned to create features and spaces, forming devices, such as transistors, capacitors, and resistors. These devices are then interconnected to achieve a desired electrical function, thereby producing an integrated circuit (IC). The formation and patterning of the various device layers are achieved using conventional fabrication techniques, such as oxidation, implantation, deposition, epitaxial growth of silicon, lithography, etching, and planarization. Such techniques are described in S. M. Sze, *VLSI Technology*, 2nd ed., New York, McGraw-Hill, 1988, which is herein incorporated by reference for all purposes.

To increase throughput, a plurality of ICs are fabricated on a wafer in parallel. The ICs are then separated into individual chips. The process of separating the wafer into individual chips is typically referred to as "dicing." Conventionally, various dicing techniques, such as "grind-cut" and "scribe and break", are employed. Such conventional dicing techniques are described in U.S. Pat. No. 3,942,508 to Shimizo, which is herein incorporated by reference for all purposes.

Referring to FIG. 1, a portion of a wafer 100 is depicted. Illustratively, the wafer comprises ICs 114 and 115 separated by a channel 120. Channel 120 is the area in which the dicing tool cuts or scribes to separate the ICs. The width of the channel is, for example, about 100 microns (µm). Typically, the channel is covered with a dielectric layer 121, such as oxide. The surface of the wafer is covered with hard and soft passivation layers 124 and 125, respectively. The hard passivation layer, for example, comprises silicon dioxide or silicon nitride and the soft passivation layer comprises polymide. The passivation layers serve to protect the surface of the ICs. Prior to wafer dicing, the passivation layers in the channel are typically removed, leaving a portion of the dielectric layer of the metallization.

As the dicing tool cuts or scribes the wafer, cracks and chips result. Due to the properties of the typical dielectric layer, cracks propagate from the area where the dicing tool cuts the wafer. Cracks in excess of a few microns in depth and several tenths of millimeters in length have been observed. In some instances, such cracks can extend from the cutting edge into the active chip areas, causing significant reliability degradation in the resulting ICs. This decreases the yield of ICs per wafer.

From the above discussion, it is apparent that there is a need to reduce the propagation of cracks and chips that result from dicing.

SUMMARY OF THE INVENTION

The invention relates to crack stops for reducing the severity of cracks resulting from dicing of a semiconductor wafer into a plurality of chips. In accordance with the invention, discontinuities in the thickness of the dielectric layer in the channel regions are created near the edges of the active regions of the ICs, separating the dicing and active chip areas. The discontinuities serve as crack stops by inhibiting the propagation of cracks into the active regions of the ICs. The discontinuities result in an increase and/or decrease in the thickness of the dielectric layer. The discontinuities are created as part of existing FEOL and/or BEOL processes with design modifications, such as changing the design of the lithographic masks used for these processes. As such, the formation of the crack stops does not require additional process steps. Thus, raw process time needed to fabricate the ICs is not increased while improving the yield of chips per wafer.

BRIEF DESCRIPTION OF THE DRAWINGS

FIG. 6 show exemplary embodiment of the invention for creating discontinuities by decreasing the thickness of the dielectric layer.

DETAILED DESCRIPTION OF THE INVENTION

The present invention reduces the severity of cracks that result from dicing a semiconductor wafer into a plurality of individual chips. As previously discussed, cracks can penetrate into the active regions of an IC, thus rendering it inoperable. In accordance with the invention, discontinuities in the thickness of the dielectric layer are created near the edges of the ICs. The discontinuities serve as crack stops, interrupting and inhibiting the migration of cracks. Thus, the discontinuities reduces or prevents cracks from penetrating into the active regions of the ICs.

Figure 1:
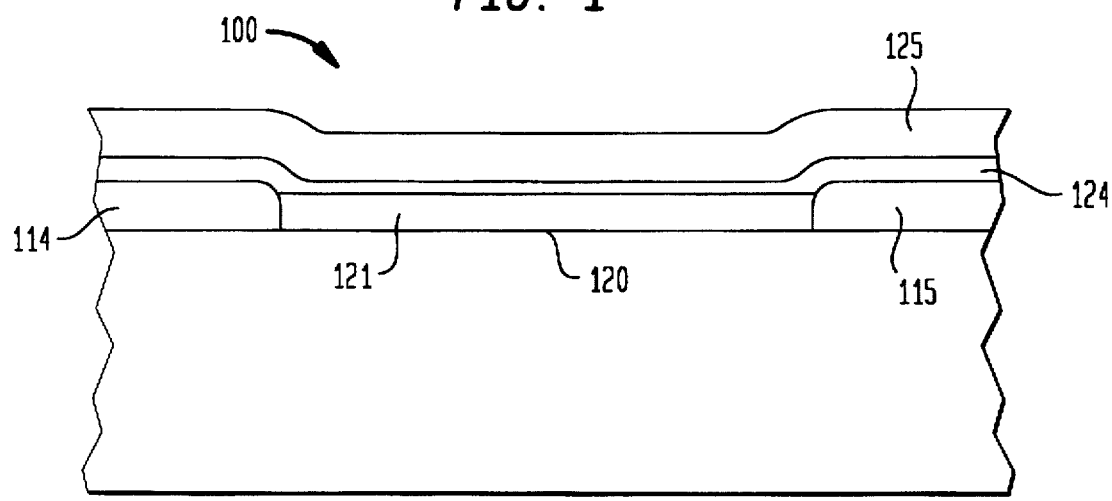
FIG. 1 shows a portion of a wafer having a plurality of ICs fabricated thereon.
Figure 2:
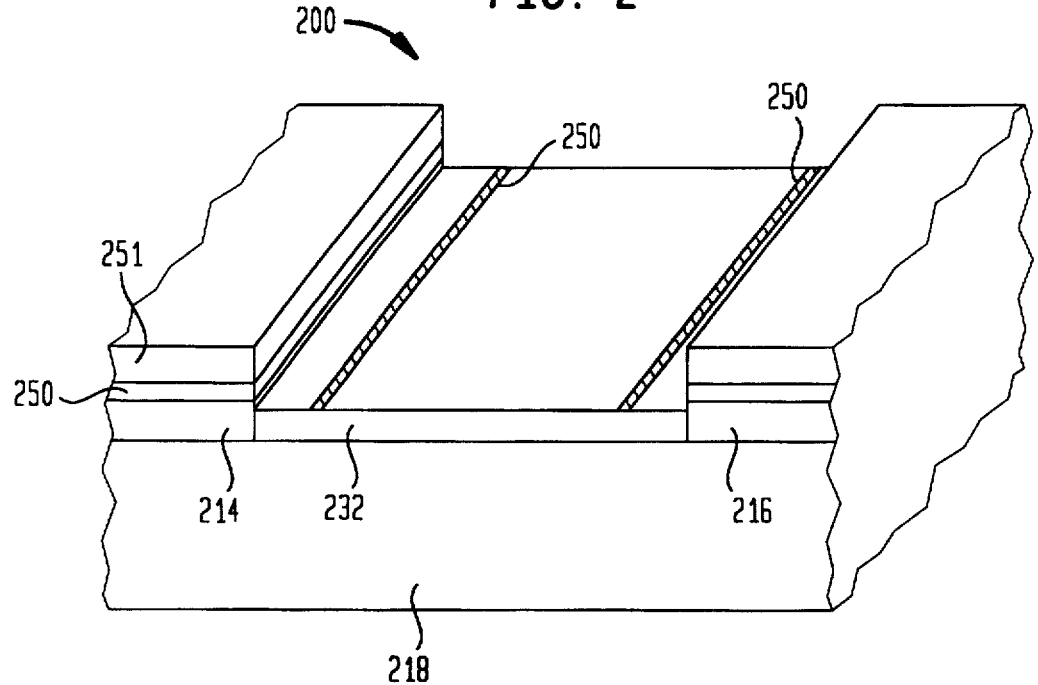
FIG. 2 illustratively shows a semiconductor substrates comprising crack-stop structures in the dicing channels for reducing or preventing cracks that result from dicing from propagating into the active regions of the ICs.

FIG. 2 shows a representative portion of a wafer 10 incorporating the invention. Illustratively, the portion comprises ICs 214 and 216 (not shown in detail) separated by a channel 218. In one embodiment, the ICs are memory devices such as dynamic random access memories (DRAMs) or synchronous DRAMs (SDRAMs). Channel 218 is the area in which the dicing tool cuts to separate the ICs. A dielectric layer 232 typically covers the surface of the wafer in the channel. The dielectric layer comprises, for example, silicon dioxide ($SiO_2$), silicon nitride ($Si_3N_4$), or LP-CVD silicon nitride ($SiN_x$). The dielectric layer is formed by, for example, chemical vapor deposition (CVD) or spin-on techniques, which is described in *VLSI Technology* and is already herein incorporated by reference for all purposes. Hard and soft passivation layers 250 and 251 are formed over the surface of the wafer to protect the surface of the ICs. To facilitate wafer dicing, the hard and soft passivation layers over the channel region are removed by lithographic and etching techniques.

Discontinuities 250 in the thickness of the dielectric layer are created in the perimeter of the dicing channel near the edges of the ICs. The discontinuities increase and/or decrease the thickness of the dielectric layer. It has been observed that virtually any discontinuity in thickness within the dielectric layer reduces or stops the cracks from propagating further. Illustratively, two rows of discontinuities are created on either side of the channel near the edges of the ICs. Illustratively, the two rows are substantially parallel to each other in order to conserve surface area of the wafer.

The discontinuities are useful when employed with conventional crack stop techniques to enhance or augment their crack stop efficiency. Conventional crack stop techniques include, for example, complete removal of the dielectric layer or layers. Such techniques are described in U.S. Pat. No. 4,610,079 to Abe et al., which is herein incorporated by reference for all purposes. The discontinuities are also useful when employed as the primary crack stop (i.e., in substitution of conventional crack stop techniques) as a more efficient technique for inhibiting the propagation of cracks into the active regions of the ICs.

In one embodiment, the discontinuities are created by forming surface steps in the substrate prior to covering the substrate with the dielectric layer. The surface steps are formed using conventional lithographic and etching techniques. Conventional etching techniques include, for example, wet chemical etch and reactive ion etch (RIE). Such techniques are described in, for example, Runyan et al., *Semiconductor Integrated Circuit Processing Technology*, Addison-Wesley (1990), which is herein incorporated by reference for all purposes.

The surface steps that create discontinuities in the thickness of the dielectric layer are formed, for example, during existing front-end-of-line (FEOL) processes for fabricating ICs and memory devices. As an illustration, the surface steps are formed as part of the process for forming isolation regions that separate active areas of devices within the ICs. The surface steps are defined by including, for example, additional patterns in the isolation mask. The additional patterns correspond to the surface steps in the channel region. The additional patterns may take on various shapes and have different configurations, as will be apparent from the following discussion. In addition, the specific isolation technology or FEOL process is not important, just that discontinuity in the thickness of the dielectric layer results. For example, shallow trench isolation (STI) or local isolation (LOCOS) is useful. Other FEOL processes that are useful include, for example, formation of deep trenches (DTs) to create trench capacitors used in memory devices such as DRAMs and SDRAMs or other process that creates surface steps. DT patterns are included in the channel region to define surface steps therein. Formation of DTs creates variations in thickness of the dielectric layer.

Once the surface steps have been defined along with the STIs, the substrate is etched. As a result, depressions are formed in the defined regions of the substrate. The defined regions include those regions where the surface steps and STIs have been defined. The STIs and surface steps are then filled with a dielectric material. Subsequent processing includes forming a dielectric layer which covers the channel region.

Figure 3:
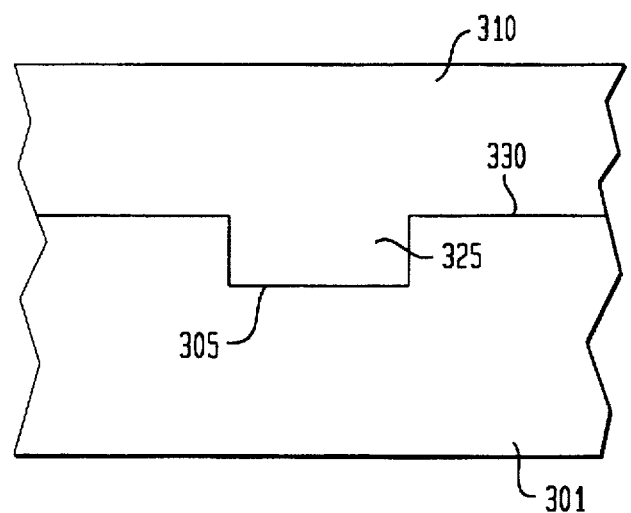
FIG. 3 shows an exemplary embodiment of the invention for creating discontinuities by increasing the thickness of the dielectric layer.

FIG. 3 shows a cross section of a portion of the channel region having surface steps formed therein. As shown, a surface step 305 formed on a substrate 301 creates discontinuities in the thickness of the dielectric layer 310. In particular, the thickness of the dielectric layer in an area 325 comprising the surface step is greater than that of areas 330 without the surface steps. By placing a series of these structures in the channel near the edges of the ICs, an effective crack stop is formed. The discontinuity in thickness in the dielectric layer effectively reduces or prevents the transmission or propagation of cracks into the active regions of the ICs. This is because cracks that spread out from the cutting area encounter the discontinuities, which effectively interrupt the cracks' migration towards the individual integrated circuit structures. As a results, damage to ICs caused by cracks is reduced.

Figure 4:
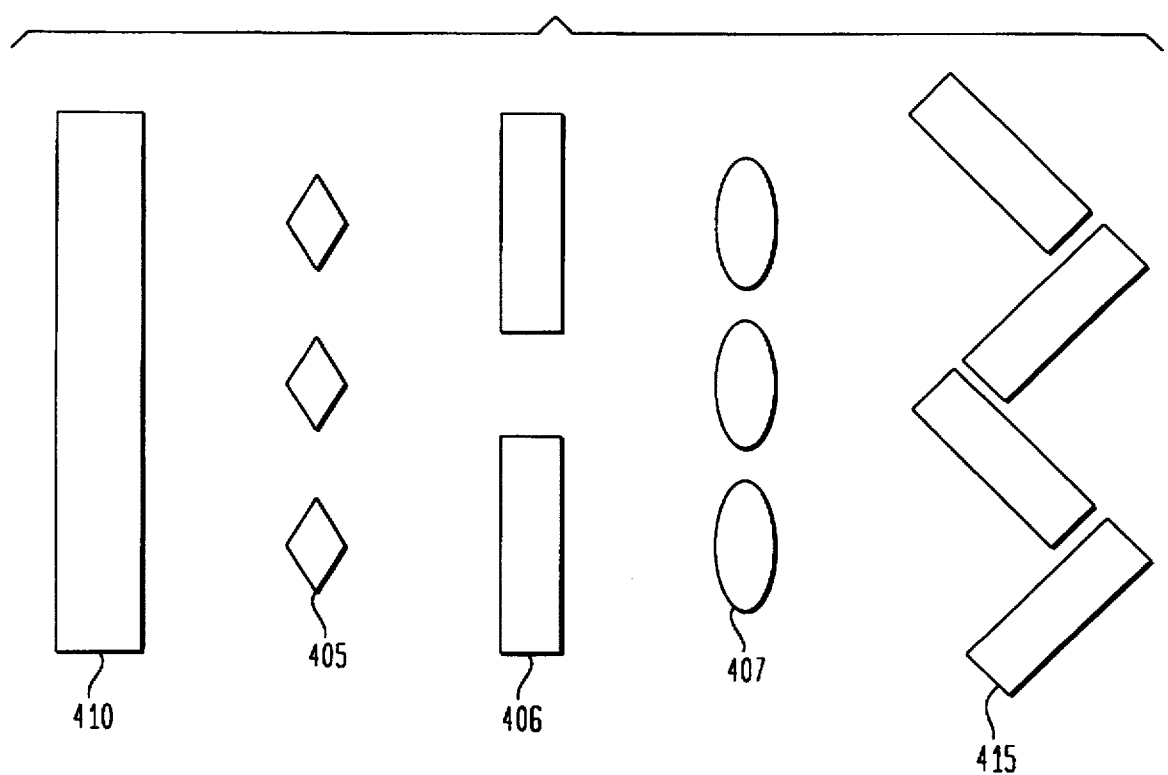
FIG. 4 shows exemplary shapes and configurations of the discontinuities.

The shapes and configurations of the surface steps are not primarily important to the effectiveness of the crack stop. What is important is that discontinuities in the thickness of the dielectric layer result from the surface steps. Referring to FIG. 4, exemplary shapes and configurations for the surface steps are shown. As shown, diamond-shaped 405, square or rectangular-shaped 406, and oval or circular-shaped 407 surface steps are useful. Other geometric shapes are also useful. In one embodiment, a series of surface steps are formed in a linear configuration along the edges of the ICs, as exemplified by surface steps 405, 406, and 407. It is not necessary that the series of surface steps all have the same shape. A combination of the various shaped surface steps is also effective to serve as a crack stop. Alternatively, a continuous surface step 410 is formed along the edges of the ICs. The continuous surface step may also comprise various geometric shapes. Another effective crack stop configuration is a zigzag 415 design. The aforementioned structures are defined in the channel region by adding the desired pattern in, for example, the isolation or DT mask. Thus, the formation of the crack stop requires only the addition of the desired patterns in the appropriate mask with no additional process steps.

In another embodiment, the discontinuity is created by forming structures to decrease the thickness of the dielectric layer. Such structures are formed, for example, during back-end-of-line (BEOL) processes. BEOL processes include the formation of various metal layers for interconnections in the IC. To facilitate understanding of the invention utilizing BEOL processes, a discussion of BEOL processes is provided.

Figure 5:
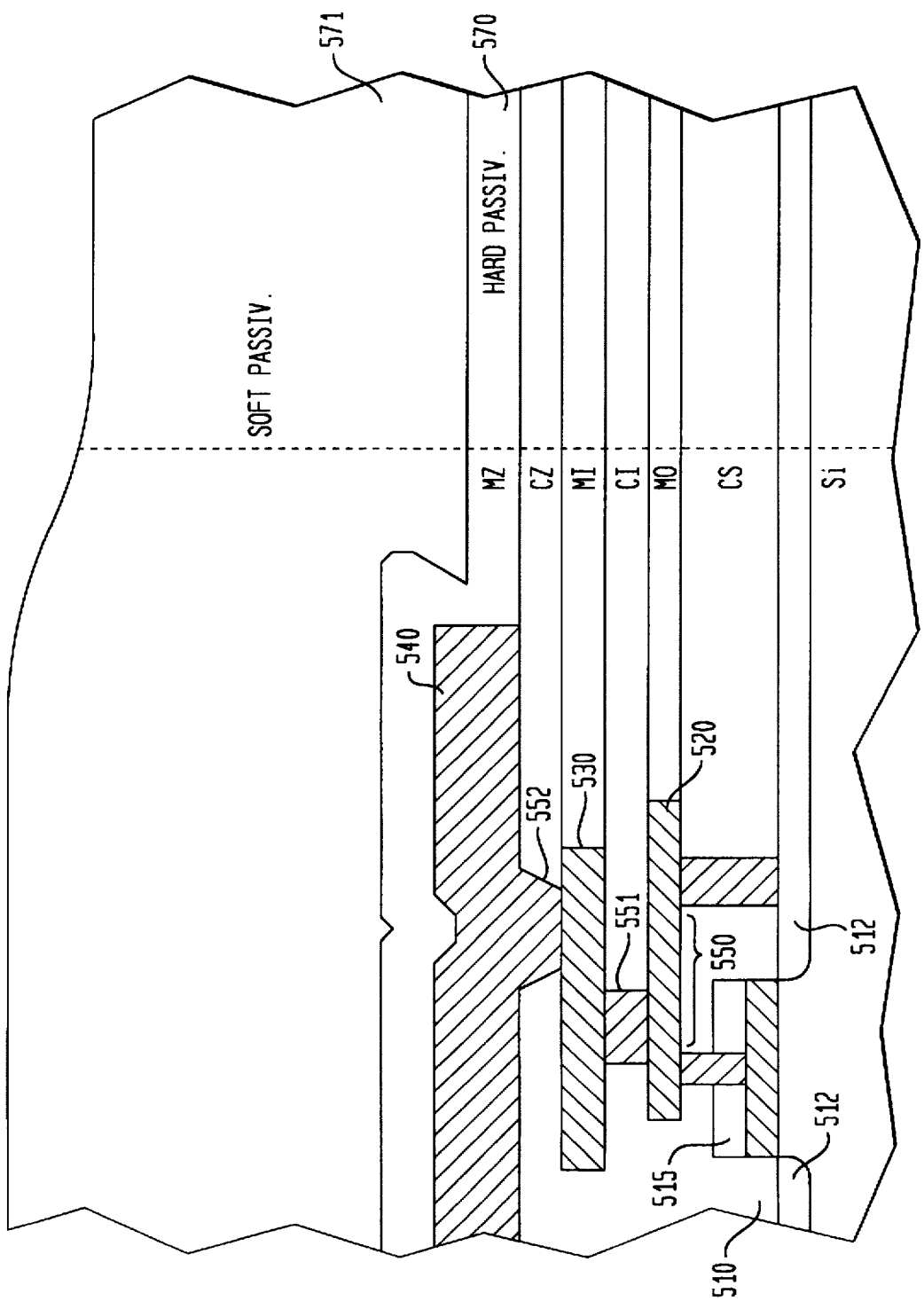
FIG. 5 illustratively shows back-end-of-line processes for a conventional dynamic random access memory.

Referring to FIG. 5, various metal layers, such as those employed in a conventional DRAM, are shown. Clearly, the illustration is not an exact representation of the metal interconnections in a DRAM chip. The illustration merely exemplifies the various metal layers typically employed. These layers may vary with different metallization or interconnection schemes.

As discussed, the metal layers are used to provide interconnections of various devices in the DRAM or IC. To insulate the various metal layers from each other, dielectric layers comprising, for example, oxide are formed therebetween. Contacts 550, 551, and 552 are formed where interlevel connections between metal layers are desired. Formation of the contacts is achieved by employing conventional techniques such as those described in Einspruch et al., "VLSI Electronic Microstructure Science," Vol. 15 *VLSI Metallization*, Academic Press (1987), ISBN 0-12-234115-5, which is herein incorporated by reference for all purposes.

As shown, a transistor 510 is formed on the surface of a substrate. The transistor, for example, is the pass transistor that is connected to a capacitor in a DRAM cell. The transistor comprises a gate 511 and source and drain regions 512. The gate, referred to as the gate contact (GC), usually represents a word-line in the DRAM array. Above the GC is a metal layer 520, referred to as the M0 layer. The M0 and CG are insulated from each other by a dielectric material. Contacts 550 connect the gate and source of the transistor, providing a bit-line connection in the DRAM array. The contact level that interconnects the M0 and GC is referred to as the CS level. Typically, conventional IC design includes multi-level metal layers. For example, a metal layer 530, referred to as the M1 layer, is provided above the M0 layer. The interconnection level between M1 and M0 layers is referred to as the C1 level. A M2 metal layer 540 is provided above the M1 layer. The metal layers may comprise, for example, aluminum (Al) alloys, tungsten (W), copper (Cu), titanium (Ti), metal derivatives such as titanium silicide and titanium nitride, or other conventional materials used to form metal layers. Hard and soft passivation layers 570 and 571, respectively, are formed above the M2 layer to protect the DRAM chip.

The right side of the dotted line in FIG. 5 exemplifies the channel region. As shown, the channel region comprises the dielectric layer of the metallization. Above the dielectric layer are passivation layers. In some applications, kerf test structures with metallization films (not shown) are formed in the channel regions.

FIG. 6 shows an exemplary embodiment of the invention for creating discontinuities by reducing the thickness of the dielectric layer. Reduction in the thickness of the dielectric layer is achieved by incorporating metal layers 674 and 678 to form a metallization stack 670. Metal layers 674 and 678 correspond to M0 and M1 BEOL processes, respectively. The metal layers are interconnected with contacts 676 and 672, which correspond to C1 and CS, respectively. Alternatively, the metal layers are not interconnected, in which case, a dielectric layer separates the M0 and M1 layers.

Typically, the passivation layers are removed from the channel regions prior to dicing. However exposure of the metal layers to air can cause corrosion or contamination. To prevent the metal from corrosion, the metallization stacks are formed such that they remain covered by the dielectric layer, even after the passivation layers are removed. The exemplary embodiment of FIG. 6 comprises the metallization stack that includes M0 and M1 layers.

In accordance with the invention, a continuous or a series of metallization stacks are formed near the edges of the ICs in the channel to create discontinuities in the dielectric layers. Like the embodiment which forms steps to create discontinuities, the metallization stacks can take on various shapes and configurations to serve as edge stops. Alternatively, integrating the metallization stacks with surface steps is also useful in serving as crack stops.

The metallization stacks are formed utilizing existing BEOL processes. Formation of the metallization stacks merely require a design change in the masks used to define the M0, M1 CS, and C1 layers. For example, metal layers 678 and 674 are formed by adding the desired patterns in the M0 and M1 layers at the appropriate locations. The interconnections are formed, for example, using conventional techniques for forming contacts in the CS and C1 levels. As such formation of the metallization stacks does not require additional process steps.

As described, the invention advantageously creates discontinuities in the dielectric layer to provide an effective crack stop. The crack stop inhibits the propagation of cracks and chips produced by the dicing process well before the cracks enter the active regions of the ICs. Consequently, the ICs are protected from being potentially damaged by cracks propagating into the active regions of the ICs in the absence of the crack stop. The discontinuities, whether created by increasing or decreasing the thickness in the dielectric layer, are formed as part of the process flow for fabricating the IC. Thus, only a design change is required, not additional process steps or process changes. In addition, the discontinuities enable a reduction in the dicing channel width, which increases the available area for ICs to be formed per wafer.

While the invention has been particularly shown and described with reference to various embodiments, it will be recognized by those skilled in the art that modifications and changes may be made to the present invention without departing from its scope. Merely by way of example, the structures that produce a discontinuity in the thickness of the dielectric layer in the channel regions can have various shapes or configurations. Therefore, the scope of the invention should be determined not with reference to the above description but with reference to the appended claims along with their full scope of equivalents.

What is claimed is:

1. In the fabrication of integrated circuits, a method for forming crack stops that reduce propagation of cracks, the method comprising the acts of:

providing a semiconductor wafer comprising integrated circuits fabricated thereon, wherein the integrated circuits are separated by dicing channels having therein a dielectric layer formed of a dielectric material; and forming discontinuities in the dielectric material in the channels to reduce the propagation of cracks along said dielectric layer that result during dicing of the wafer to separate the integrated circuits, wherein the discontinuities are formed as part of the process for fabricating the integrated circuits such that no additional process is required for forming the discontinuities; and forming a passivation layer above said dielectric layer, said passivation layer being formed of a passivation material different from said dielectric material.

2. The method of claim 1 wherein said forming said discontinuities further includes, forming a surface step on a substrate of said semiconductor wafer, said substrate being disposed below said dielectric layer, wherein said dielectric layer is thickened in a region above said surface step.

3. The method of claim 2 wherein the integrated circuits represent dynamic random access memory (DRAM) circuits.

4. The method of claim 2 wherein said forming said surface step is part of a front-end-of-line (FEOL) process.

5. The method of claim 4 wherein said FEOL process represents a process for forming isolation regions in said substrate.

6. The method of claim 4 wherein said FEOL process represents a process for forming shallow trench isolation (STI) regions in said substrate.

7. The method of claim 4 wherein said FEOL process represents a local oxidation of silicon (LOCOS) process.

8. The method of claim 4 wherein said FEOL process represents a process for forming a deep trench (DT) device in said substrate.

9. The method of claim 1 wherein said dielectric layer represents an intermetal dielectric layer, said passivation layer being configured to be removed prior to said dicing.

10. The method of claim 1 wherein said forming said discontinuities further includes, forming a structure in said dielectric layer to reduce an amount of said dielectric material in said dielectric layer.

11. The method of claim 10 wherein the integrated circuits represent dynamic random access memory (DRAM) circuits.

12. The method of claim 10 wherein said structure is part of a metallization stack, said metallization stack including a metal contact through said dielectric layer.

13. The method of claim 10 wherein said forming said discontinuities further includes, forming a surface step on a substrate of said semiconductor wafer, said substrate being disposed below said dielectric layer, wherein said dielectric layer is thickened in a region above said surface step.

* * * * *